(12) United States Patent
Becker et al.

(10) Patent No.: US 10,896,799 B1
(45) Date of Patent: Jan. 19, 2021

(54) ION SOURCE WITH MULTIPLE CONFIGURATIONS

(71) Applicant: Applied Materials, Inc., Santa Clara, CA (US)

(72) Inventors: Klaus Becker, Kensington, NH (US); Carlos M. Goulart, Gloucester, MA (US); Daniel Alvarado, Methuen, MA (US); Daniel R. Tieger, Manchester, MA (US); Alexander S. Perel, Danvers, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/555,064

(22) Filed: Aug. 29, 2019

(51) Int. Cl.
| | | |
|---|---|---|
| H01J 37/08 | (2006.01) | |
| H01J 27/08 | (2006.01) | |
| H01J 37/24 | (2006.01) | |
| H01J 37/248 | (2006.01) | |
| H01J 37/16 | (2006.01) | |
| H01J 27/02 | (2006.01) | |

(52) U.S. Cl.
CPC ............. *H01J 37/08* (2013.01); *H01J 27/02* (2013.01); *H01J 27/08* (2013.01); *H01J 37/16* (2013.01); *H01J 37/241* (2013.01); *H01J 37/248* (2013.01)

(58) Field of Classification Search
CPC ........ H01J 27/02; H01J 27/022; H01J 27/024; H01J 27/20; H01J 27/205; H01J 37/08; H01J 37/16; H01J 37/241; H01J 37/248; H01J 27/08
See application file for complete search history.

(56) References Cited

U.S. PATENT DOCUMENTS

| | | | | |
|---|---|---|---|---|
| 4,870,284 A * | 9/1989 | Hashimoto | ............. | H01J 27/14 250/423 R |
| 7,812,321 B2 * | 10/2010 | Kurunczi | ................ | H01J 37/08 250/424 |
| 8,330,127 B2 * | 12/2012 | Low | ........................ | H01J 37/08 250/492.21 |
| 9,691,584 B1 * | 6/2017 | Tieger | ................. | H01J 37/3266 |
| 9,818,570 B2 * | 11/2017 | Alvarado | ................. | H05H 1/03 |
| 10,290,461 B1 | 5/2019 | Tieger et al. | | |
| 2017/0140898 A1 * | 5/2017 | Kawaguchi | ....... | H01J 37/32614 |

\* cited by examiner

*Primary Examiner* — David E Smith
(74) *Attorney, Agent, or Firm* — Nields, Lemack & Frame, LLC (57) ABSTRACT

An IHC ion source with multiple configurations is disclosed. For example, an IHC ion source comprises a chamber, having at least one electrically conductive wall, and a cathode and a repeller disposed on opposite ends of the chamber. Electrodes are disposed on one or more walls of the ion source. Bias voltages are applied to at least one of the cathode, repeller and the electrodes, relative to the electrically conductive wall of the chamber. Further, the IHC ion source comprises a configuration circuit, which receives the various voltages as input voltages, and provides selected output voltages to the cathode, repeller and electrodes, based on user input. In this way, the IHC ion source can be readily reconfigured for different applications without rewiring the power supplies, as is currently done. This configuration circuit may be utilized with other types of ion sources as well.

20 Claims, 7 Drawing Sheets

ION SOURCE WITH MULTIPLE CONFIGURATIONS

FIELD

Embodiments of the present disclosure relate to an ion source, and more particularly, an indirectly heated cathode (IHC) ion source where the voltage applied to various components, such as the cathode, repeller and electrodes, can be easily reconfigured.

BACKGROUND

Various types of ion sources may be used to create the ions that are used in semiconductor processing equipment. For example, Freeman ion sources operate by supplying a current to a filament that passes from one end of the chamber to the opposite end. A Bernas ion source and a Calutron ion source operate by supplying a current to a filament that is disposed near one end of the chamber. In each of these sources, the filament emits thermionic electrons that are emitted into the chamber. These electrons collide with the feed gas to create a plasma.

Another type of ion source is the indirectly heated cathode (IHC) ion source. IHC ion sources operate by supplying a current to a filament disposed behind a cathode. The filament emits thermionic electrons, which are accelerated toward and heat the cathode, in turn causing the cathode to emit electrons into the chamber of the ion source. Since the filament is protected by the cathode, its life may be extended relative to a Bernas ion source. The cathode is disposed at one end of a chamber. A repeller is typically disposed on the end of the chamber opposite the cathode. The cathode and repeller may be biased so as to repel the electrons, directing them back toward the center of the chamber. In some embodiments, a magnetic field is used to further confine the electrons within the chamber.

In certain embodiments of these ion sources, side electrodes are also disposed on one or more walls of the chamber. These side electrodes may be positively or negatively biased so as to control the position of ions and electrons, so as to increase the ion density near the center of the chamber. An extraction aperture is disposed along another side, proximate the center of the chamber, through which the ions may be extracted.

Different voltages can be applied to the cathode, repeller and side electrodes to achieve specific results. For example, certain configurations are preferable to create single charged ions. Other configurations may be preferable to create highly charged ions. In other words, the selection of the voltage to be applied to the cathode, repeller and the electrodes depends on the application. However, reconfiguring the IHC ion source for each application is time consuming and reduces the throughput of the system.

Therefore, an ion source with multiple configurations may be beneficial. Further, it would be advantageous if the ion source was easily reconfigurable.

SUMMARY

An IHC ion source with multiple configurations is disclosed. For example, an IHC ion source comprises a chamber, having at least one electrically conductive wall, and a cathode and a repeller disposed on opposite ends of the chamber. Electrodes are disposed on one or more walls of the ion source. Bias voltages are applied to at least one of the cathode, repeller and the electrodes, relative to the electrically conductive wall of the chamber. Further, the ion source comprises a configuration circuit, which receives the various voltages as input voltages, and provides selected output voltages to the cathode, repeller and electrodes, based on user input. In this way, the IHC ion source can be readily reconfigured for different applications without rewiring the power supplies, as is currently done. This configuration circuit may be utilized with other types of ion sources as well.

According to one embodiment, an ion source is disclosed. The ion source comprises a chamber, comprising at least one electrically conductive wall; a cathode disposed on one end of the chamber; a repeller disposed on an opposite end of the chamber; a first electrode disposed on one side wall; a second electrode disposed on a second sidewall; a configuration circuit in electrical communication with the electrically conductive wall; at least one power supply in communication with the configuration circuit; wherein the configuration circuit selects an output voltage to be supplied to at least one of the cathode, the repeller, the first electrode and the second electrode based on an input. In certain embodiments, the output voltage is supplied to the cathode, the at least one power supply comprises a cathode bias power supply and the output voltage is an output voltage from the cathode bias power supply or a voltage of the electrically conductive wall. In certain embodiments, the output voltage is supplied to the repeller, the at least one power supply comprises a cathode bias power supply and the output voltage is an output voltage from the cathode bias power supply or a voltage of the electrically conductive wall. In certain embodiments, the output voltage is supplied to the first electrode, the at least one power supply comprises an electrode power supply and the output voltage is an output voltage from the electrode power supply or a voltage of the electrically conductive wall. In certain embodiments, the output voltage is supplied to the second electrode, the at least one power supply comprises an electrode power supply and the output voltage is an output voltage from the electrode power supply or a voltage of the electrically conductive wall. In certain embodiments, the configuration circuit comprises a plurality of relays. In some further embodiments, the relays comprise single pole, double throw relays using magnetic coils. In certain embodiments, the configuration circuit comprises a cross point matrix. In certain embodiments, the output voltage is supplied to the cathode and is also supplied to the repeller. In some embodiments, the at least one power supply comprises an electrode power supply and a cathode bias power supply and the configuration circuit is adapted to select the output voltage for each of the cathode, the repeller, the first electrode and the second electrode so as to support at least four different configurations. In a further embodiment, one of the four different configurations comprises a first configuration, where the cathode and repeller are electrically connected to the output voltage of the cathode bias power supply, and the first electrode and the second electrode are electrically connected to the electrically conductive wall. In a further embodiment, one of the four different configurations comprises a second configuration, where the cathode and repeller are electrically connected to the output voltage of the cathode bias power supply, and the second electrode is electrically connected to the electrically conductive wall and the first electrode is electrically connected to the output voltage of the electrode power supply. In a further embodiment, one of the four different configurations comprises a third configuration, where the cathode, the repeller and the second electrode are electrically connected to the electrically conductive wall, and the first electrode is electrically connected to the output voltage of the electrode power supply. In a further embodiment, one of the four different configurations comprises a fourth configuration, where the cathode and the repeller are electrically connected to the electrically conductive wall, and the first electrode and the second electrode are electrically connected to the output voltage of the electrode power supply.

According to another embodiment, an ion source is disclosed. The ion source comprises a chamber, comprising at least one electrically conductive wall; a configuration circuit in electrical communication with the electrically conductive wall; a plurality of power supplies, an output voltage of each of plurality of power supplies in communication with the configuration circuit; and at least one component, wherein the components comprise: a cathode disposed on one end of the chamber; a repeller disposed on an opposite end of the chamber; a first electrode disposed on one side wall; and a second electrode disposed on a second sidewall; wherein the configuration circuit selects an output voltage to be supplied to the at least one component, wherein each output voltage is selected from the output voltage of one of the plurality of power supplies or a voltage of the electrically conductive wall such that the configuration circuit allows the ion source to be operated in a plurality of modes. In certain embodiments, the ion source comprises at least two of the components. In a further embodiment, the configuration circuit supplies an output voltage to each of the components. In certain embodiments, the ion source further comprises at least one of a top electrode disposed on an extraction plate and a bottom electrode disposed on a wall opposite the extraction plate, wherein the configuration circuit selects an output voltage to be supplied to the top electrode or the bottom electrode.

According to another embodiment, an ion source is disclosed. The ion source comprises a chamber, comprising at least one electrically conductive wall; a cathode disposed on one end of the chamber; a repeller disposed on an opposite end of the chamber; one or more electrodes disposed on the walls of the chamber; a configuration circuit in electrical communication with the electrically conductive wall; a cathode bias power supply in communication with the configuration circuit; an electrode power supply in communication with the configuration circuit; and a controller; wherein the controller provides an input to the configuration circuit, and the configuration circuit selects an output voltage to be supplied to the cathode, the repeller, and the electrodes based on the input. In certain embodiments, the controller comprises an input device, and an operator enters information via the input device, and the controller uses the information to provide the input to the configuration circuit.

BRIEF DESCRIPTION OF THE FIGURES

For a better understanding of the present disclosure, reference is made to the accompanying drawings, which are incorporated herein by reference and in which.

DETAILED DESCRIPTION

As described above, ion sources may be configured differently depending on the desired application. However, rewiring the electrical connections for the cathode, repeller and electrodes of the ion source is time consuming and results in increased downtime and lower utilization of the implantation system.

Figure 1:
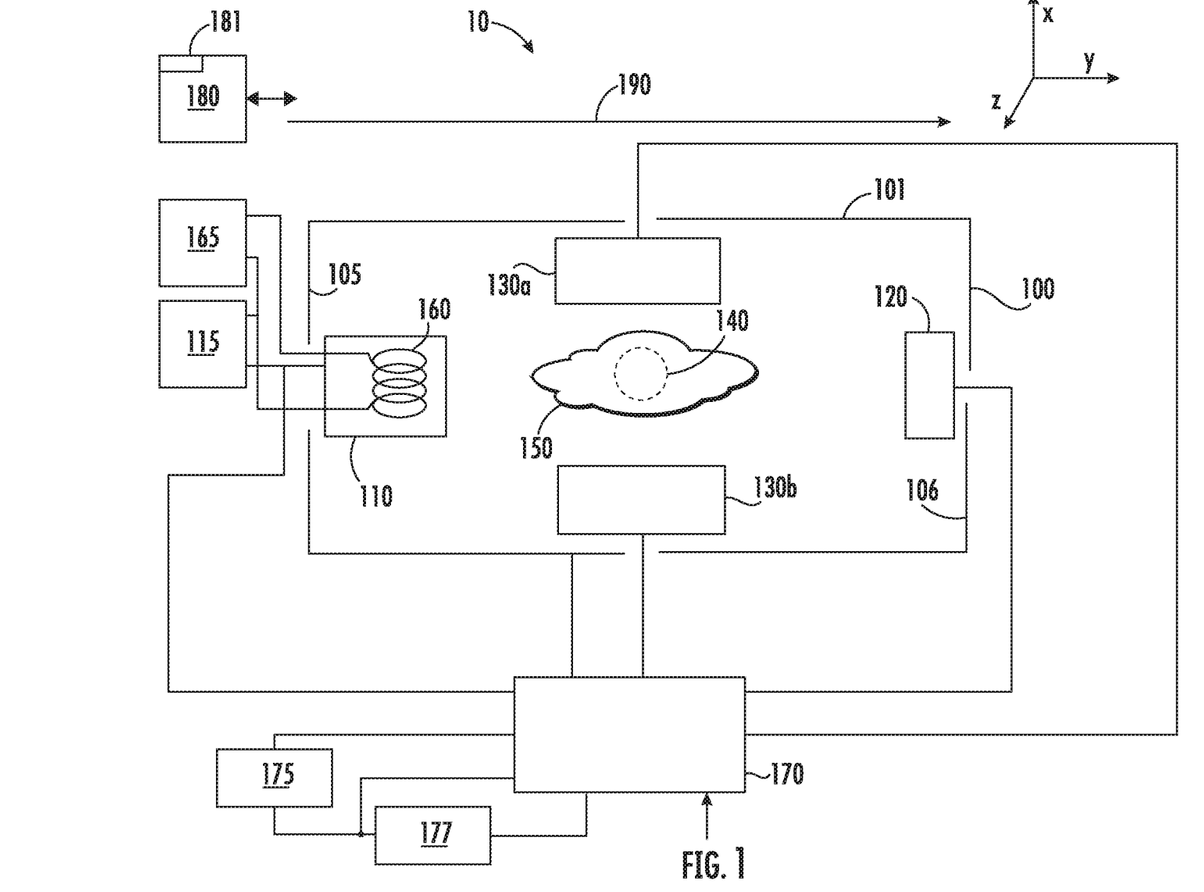
FIG. 1 is an ion source with a configuration circuit in accordance with one embodiment.
Figure 2:
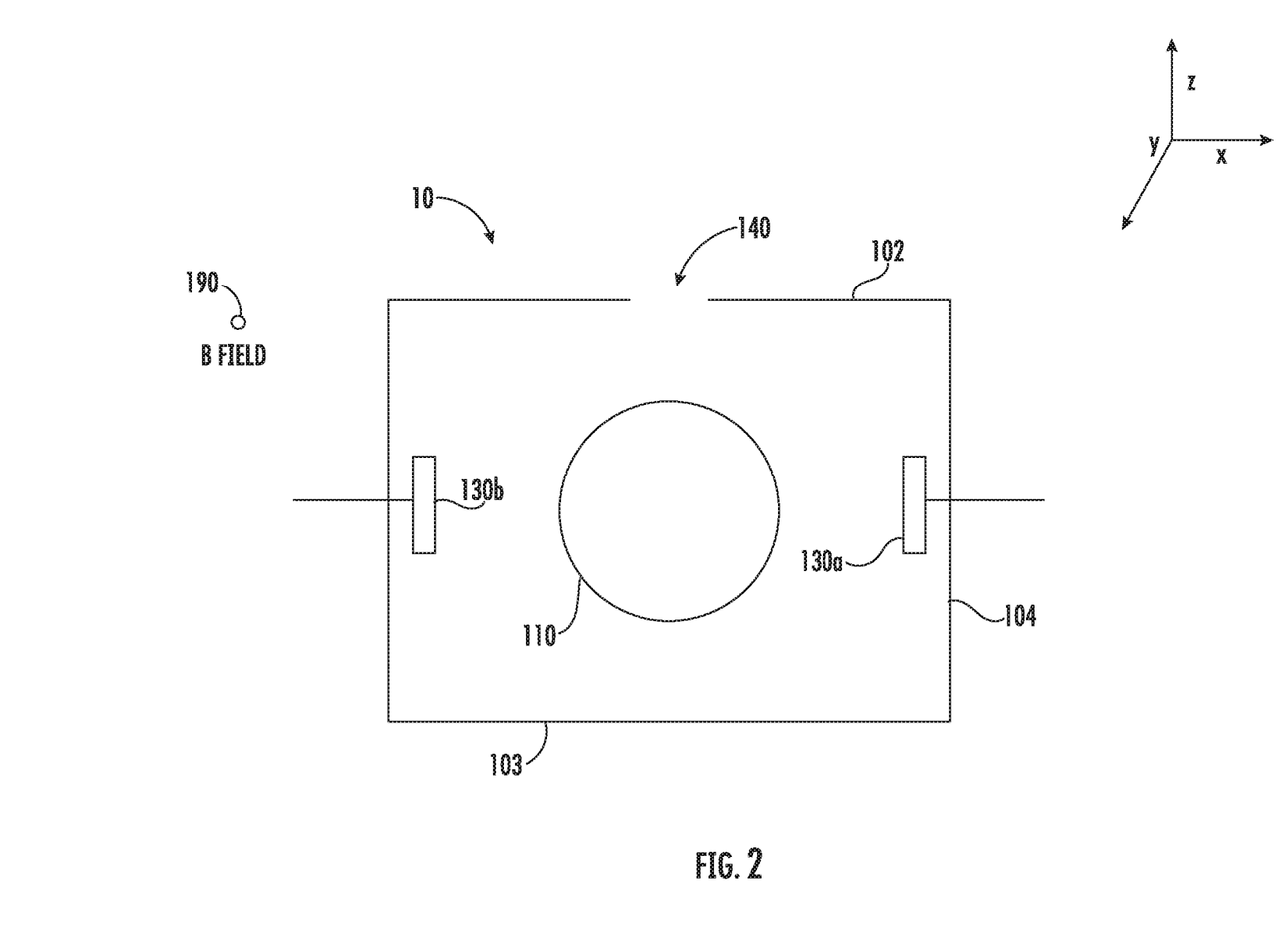
FIG. 2 is a cross-sectional view of the IHC ion source of FIG. 1.

FIG. 1 shows an ion source 10 that overcomes these issues. FIG. 2 shows a cross-section of the ion source of FIG. 1. The ion source 10 may be an indirectly heated cathode (IHC) ion source. The ion source 10 includes a chamber 100, comprising two opposite ends, and chamber walls 101 connecting to these ends. These chamber walls 101 include side walls 104, an extraction plate 102 and a bottom wall 103 opposite the extraction plate 102. The chamber walls 101 of the chamber 100 may be constructed of an electrically conductive material and may be in electrical communication with one another. In certain embodiments, all of the chamber walls 101 are electrically conductive. In other embodiments, at least one chamber wall 101 is electrically conductive. A cathode 110 is disposed in the chamber 100 at a first end 105 of the chamber 100. A filament 160 is disposed behind the cathode 110. The filament 160 is in communication with a filament power supply 165. The filament power supply 165 is configured to pass a current through the filament 160, such that the filament 160 emits thermionic electrons. Filament bias power supply 115 biases filament 160 negatively relative to the cathode 110, so these thermionic electrons are accelerated from the filament 160 toward the cathode 110 and heat the cathode 110 when they strike the back surface of cathode 110. The filament bias power supply 115 may bias the filament 160 so that it has a voltage that is between, for example, 200V to 1500V more negative than the voltage of the cathode 110. The cathode 110 then emits thermionic electrons on its front surface into chamber 100.

Thus, the filament power supply 165 supplies a current to the filament 160. The filament bias power supply 115 biases the filament 160 so that it is more negative than the cathode 110, so that electrons are attracted toward the cathode 110 from the filament 160. Additionally, the cathode 110 is electrically connected to the configuration circuit 170. The configuration circuit 170 provides a voltage to the cathode 110, as described in more detail below. In certain embodiments, the chamber 100 is connected to electrical ground. In certain embodiments, the chamber walls 101 provide the ground reference for the other power supplies.

In this embodiment, a repeller 120 is disposed in the chamber 100 on the second end 106 of the chamber 100 opposite the cathode 110. The repeller 120 may be in electrical communication with configuration circuit 170. As the name suggests, the repeller 120 serves to repel the electrons emitted from the cathode 110 back toward the center of the chamber 100. For example, in certain embodiments, the repeller 120 may be biased at a negative voltage relative to the chamber 100 to repel the electrons. For example, in certain embodiments, the repeller 120 is biased at between 0 and −150V relative to the chamber 100. In certain embodiments, the repeller 120 may be floated relative to the chamber 100. In other words, when floated, the repeller 120 is not electrically connected to a power supply or to the chamber 100. In this embodiment, the voltage of the repeller 120 tends to drift to a voltage close to that of the cathode 110. Alternatively, the repeller 120 may be electrically connected to the chamber walls 101.

In certain embodiments, a magnetic field 190 is generated in the chamber 100. This magnetic field is intended to confine the electrons along one direction. The magnetic field 190 typically runs parallel to the side walls 104 from the first end 105 to the second end 106. For example, electrons may be confined in a column that is parallel to the direction from the cathode 110 to the repeller 120 (i.e. the y direction). Thus, electrons do not experience electromagnetic force to move in the y direction. However, movement of the electrons in other directions may experience an electromagnetic force.

In the embodiment shown in FIG. 1, first electrode 130a and second electrode 130b may be disposed on side walls 104 of the chamber 100, such that the electrodes are within the chamber 100. The electrodes may each be in electrical communication with the configuration circuit 170. FIG. 2 shows a cross-sectional view of the ion source 10 of FIG. 1. In this figure, the cathode 110 is shown against the first end 105 of the ion source 10. First electrode 130a and second electrode 130b are shown on opposite side walls 104 of the chamber 100. The magnetic field 190 is shown directed out of the page, in the Y direction. In certain embodiments, the electrodes may be separated from the side walls 104 of the chamber 100 through the use of insulators or vacuum gaps. Electrical connections from the configuration circuit 170 may be made to the first electrode 130a and the second electrode 130b by passing a conductive material from the exterior of the chamber 100 to the respective electrode.

Each of the cathode 110, the repeller 120, the first electrode 130a and the second electrode 130b is made of an electrically conductive material, such as a metal. Each of these components may be physically separated from the chamber walls 101, so that a voltage, different from ground, may be applied to each component.

Disposed on the extraction plate 102, may be an extraction aperture 140. In FIG. 1, the extraction aperture 140 is disposed on a side that is parallel to the X-Y plane (parallel to the page). Further, while not shown, the ion source 10 also comprises a gas inlet through which the gas to be ionized is introduced to the chamber 100.

A controller 180 may be in communication with one or more of the power supplies such that the voltage or current supplied by these power supplies may be modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

The controller 180 may be used to supply control signals to the configuration circuit 170. These control signals determine the output voltages that are supplied to the cathode 110, the repeller 120, the first electrode 130a and the second electrode 130b. In certain embodiments, the controller 180 may have an input device 181, such as a keyboard, touch screen or other device. An operator may utilize this input device 181 to inform the controller 180 of the desired configuration of the ion source 10.

A cathode bias power supply 175 is in communication with the configuration circuit 170. As described in more detail below, the cathode bias power supply 175 may be used to provide a voltage to the cathode 110, in certain configurations. The positive terminal of the cathode bias power supply 175 may be electrically connected to the electrically conductive chamber walls, should that the output from the cathode bias power supply 175 is negative with respect to the chamber walls 101. An electrode power supply 177 is also in communication with the configuration circuit 170. The negative terminal of the electrode power supply 177 may be electrically connected to the electrically conductive chamber walls, such that the output from the electrode power supply 177 is positive with respect to the chamber walls 101. As described in more detail below, the electrode power supply 177 may be used to provide a voltage to one or both of the electrodes in certain configurations.

During operation, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the chamber 100. These electrons collide with the molecules of gas that are fed into the chamber 100 through the gas inlet. These collisions create positive ions, which form a plasma 150. The plasma 150 may be confined and manipulated by the electrical fields created by the cathode 110, the repeller 120, the first electrode 130a and the second electrode 130b. Further, in certain embodiments, the electrons and positive ions may be somewhat confined by the magnetic field 190. In certain embodiments, the plasma 150 is confined near the center of the chamber 100, proximate the extraction aperture 140.

The selection of the voltage applied to each of the cathode 110, the repeller 120, the first electrode 130a and the second electrode 130b may alter the operation of the system.

For example, in a first mode, the cathode 110 and the repeller 120 are negatively biased relative to the electrically conductive chamber walls, while the first electrode 130a and the second electrode 130b are both at the same potential as the electrically conductive chamber walls. This may be a traditional configuration of an indirectly heated cathode ion source, where the cathode 110 and the repeller 120 are negatively biased relative to the chamber walls 101 to repel the electrons from the ends of the chamber 100. In this mode, the cathode 110 and the repeller 120 may be biased between 0V and −150V relative to the chamber walls 101. In certain embodiments, the cathode 110 and the repeller 120 may be maintained at the same voltage so a single power supply may be used to supply a voltage to both components. This configuration may be favorable for single charge ions.

In a second mode, cathode 110 and the repeller 120 are negatively biased relative to the electrically conductive chamber walls, while the second electrode 130b is at the same potential as the electrically conductive chamber walls. In this mode, the cathode 110 and the repeller 120 may be biased between 0V and −150V relative to the chamber walls 101. In certain embodiments, the cathode 110 and the repeller 120 may be maintained at the same voltage so a single power supply may be used to supply a voltage to both components. First electrode 130a may be positively biased relative the chamber walls 101, such as at a voltage of between 0V and 600V. This configuration may be favorable for highly charged ions.

In a third mode, cathode 110, repeller 120 and the second electrode 130b are all at the same potential as the electrically conductive chamber walls. The first electrode 130a is positively biased relative the chamber walls 101, such as at a voltage of between 0V and 600V. In this embodiment, the electrons are attracted to the first electrode 130a, which is positively biased relative to the electrically conductive chamber walls. However, the electrons need to overcome electromagnetic forces to cross the magnetic field 190. Thus, the selection of the strength of the magnetic field 190 and the voltage applied by electrode power supply 177 determine the velocity and energy of the electrons as the electrons are attracted toward the first electrode 130*a*. A greater magnetic field with a low positive bias voltage applied to the first electrode 130*a* will reduce the number of electrons that are able to cross the magnetic field 190. In contrast, a weak magnetic field coupled with a greater bias voltage applied to the first electrode 130*a* will cause more electrons, moving at a higher velocity, to move toward the first electrode 130*a*.

Thus, by varying the strength of the magnetic field 190 and the voltage applied by the electrode power supply 177, the velocity and energy of the electrons may be manipulated. This mode may be favorable for single charged ions and dimers such as $P_2^+$.

In a fourth mode, cathode 110 and repeller 120 are at the same potential as the electrically conductive chamber walls. The first electrode 130*a* and the second electrode 130*b* are both positively biased relative the chamber walls 101, such as at a voltage of between 0V and 600V. In certain embodiments, the first electrode 130*a* and the second electrode 130*b* may be maintained at the same voltage so a single power supply may be used to supply a voltage to both components. This configuration may be favorable for highly charged ions such as $N^{3+}$.

Figure 3:
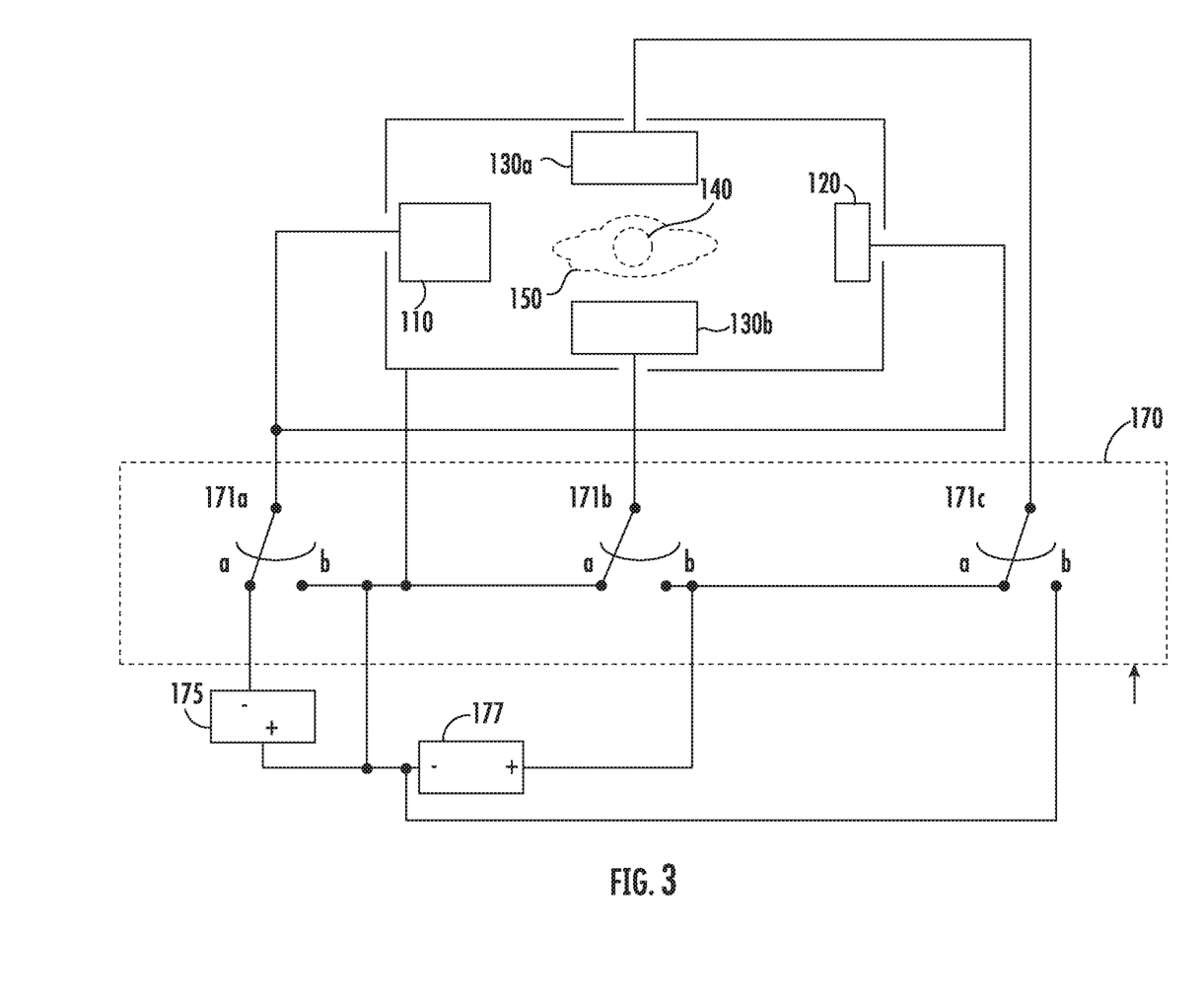
FIG. 3 is an ion source showing the circuitry within the configuration circuit in accordance with an embodiment.

FIG. 3 shows an expanded view of the configuration circuit 170 that may be used to create the voltages for each of the four modes described above. In this embodiments, three switches 171*a*, 171*b*, 171*c* are used to select the voltages that are supplied to the cathode 110, repeller 120, the first electrode 130*a* and the second electrode 130*b*.

Switch 171*a* is used to select the voltage applied to the cathode 110 and the repeller 120. This switch 171*a* may be a single pole, double throw relay. Due to the high voltages, a relay utilizing a magnet coil may be used. The switch 171*a* has two inputs and a select signal. The first input is in communication with the negative terminal of the cathode bias power supply 175, while the second input is electrically connected to the electrically conductive chamber walls. The output of the switch 171*a* is connected to one of these inputs, based on the state of the select signal. Thus, by toggling the select signal on switch 171*a*, the cathode 110 and the repeller 120 may be either biased by cathode bias power supply 175 or grounded by being electrically connected to the chamber walls 101.

Switch 171*b* is used to select the voltage applied to the second electrode 130*b*. This switch 171*b* may also be a single pole, double throw relay. Due to the high voltages, a relay utilizing a magnet coil may be used. The switch 171*b* has two inputs and a select signal. The first input is in communication with the positive terminal of the electrode power supply 177, while the second input is electrically connected to the electrically conductive chamber walls. Thus, by toggling switch 171*b*, the second electrode 130*b* may be either biased by the electrode power supply 177 or grounded by being electrically connected to the chamber walls 101.

Switch 171*c* is used to select the voltage applied to the first electrode 130*a*. This switch 171*c* may also be a single pole, double throw relay. Due to the high voltages, a relay utilizing a magnet coil may be used. The switch 171*c* has two inputs and a select signal. The first input is in communication with the positive terminal of the electrode power supply 177, while the second input is electrically connected to the electrically conductive chamber walls. The output is connected to one of these inputs, based on the state of the select signal. Thus, by toggling the select signal on switch 171*c*, the first electrode 130*a* may be either biased by the electrode power supply 177 or grounded by being electrically connected to the chamber walls 101.

Each switch has two positions, designated in FIG. 3 as a and b. The following table show the settings for the three switches 171*a*, 171*b*, 171*c* to achieve the four modes listed above.

TABLE 1

| Mode | Switch 171a position | Switch 171b position | Switch 171c position |
| --- | --- | --- | --- |
| 1 | a | a | b |
| 2 | a | a | a |
| 3 | b | a | a |
| 4 | b | b | a |

Of course, the switches 171*a*, 171*b*, 171*c* can be configured differently. In fact, the configuration circuit 170 may be configured to supply any of the input voltages (i.e. the cathode bias voltage, the electrode voltage, the chamber wall voltage) to any of the outputs (i.e. the cathode 110, the repeller 120, the first electrode 130*a*, the second electrode 130*b*). Thus, the disclosure is not limited to the embodiment shown in FIG. 3.

Furthermore, while the configuration circuit 170 is shown supplying an output voltage to each of the cathode 110, repeller 120, first electrode 130*a* and second electrode 130*b*, other embodiments are also possible. For example, in certain embodiments, the voltage supplied to one or more of these components (i.e. the cathode 110, the repeller 120, the first electrode 130*a*, the second electrode 130*b*) may not be provided by the configuration circuit 170. For example, the voltage to be applied to one or more of the components may be fixed or may be supplied from a different source. Thus, in one embodiment, the ion source 10 comprises a cathode 110, a repeller 120, a first electrode 130*a* and a second electrode 130*b*, and the configuration circuit 170 supplies an output voltage to at least one of these components.

Further, in other embodiments, the ion source 10 may not include all of the components described above. For example, in the case of a Bernas ion source, the ion source may not have a cathode 110. Further, in other embodiments, the ion source may not have one or both of the electrodes 130*a*, 130*b*. In other embodiments, the ion source may not have a repeller. Thus, in certain embodiments, the ion source comprises at least one of these components: a cathode, a repeller, a first electrode 130*a*, and a second electrode 130*b*. In other embodiments, the ion source comprises two, three or four of these components. The configuration circuit is used to supply an output voltage to these components in the ion source. In this way, the configuration circuit 170 allows the ion source to operate in a plurality of modes.

In the embodiment shown in FIG. 3, the configuration circuit 170 comprises three relays which control the voltages that are applied to the cathode 110 and repeller 120, the first electrode 130*a* and the second electrode 130*b*, respectively. The switches 171*a*, 171*b*, 171*c* may be controlled in a number of ways. In one embodiment, the configuration circuit 170 includes a corresponding number of actuators, such as manual toggle switches. Each of these actuators may be in communication with the select signal of a respective switch. In this case, an operator selects the configuration of the ion source 10 by setting the various actuators.

In another embodiment, the controller 180 is in communication with the configuration circuit 170. Thus, the operator may enter information, such as via the input device 181. The controller 180 will then configure the switches 171*a*, 171*b*, 171*c* in accordance with the information provided by the operator. In one embodiment, this information may be a command that may instruct the controller 180 of the desired settings of the switches 171*a*, 171*b*, 171*c*. In another embodiment, the operator may select a particular recipe and the controller 180 will determine the proper configuration of the switches for that recipe.

The controller 180 may transmit the desired mode to the configuration circuit 170 via any suitable means, including wired or wireless communication. In one embodiment, the controller 180 provides a set of digital signals to the configuration circuit 170, where each digital signal represents the desired state of one of the switches 171*a*, 171*b*, 171*c*.

The controller 180 may have a much lower supply voltage than the voltages used for the switches. Consequently, these digital signals from the controller 180 may be electrically isolated from the switches 171*a*, 171*b*, 171*c* by suitable means, such as optical fibers, opto-isolators, transistors, or relays. Implementations used to interface the controller 180 and the switches 171*a*, 171*b*, 171*c* are well known to those skilled in the art.

Of course, additional switches can be used as well. For example, in certain embodiments, it may be desirable to have the repeller 120 at the same voltage as the cathode 110. In other embodiments, it may be beneficial to have the repeller 120 at a different voltage, such as the same voltage as the first electrode 130*a*, or ground. Thus, a fourth switch may be used to independently select the voltage to supply to the repeller 120.

While the above disclosure describes relays utilizing a magnetic coil, the disclosure is not limited to this embodiment. Relays that utilize pneumatic air or mechanical linkages may also be employed.

Figure 4:
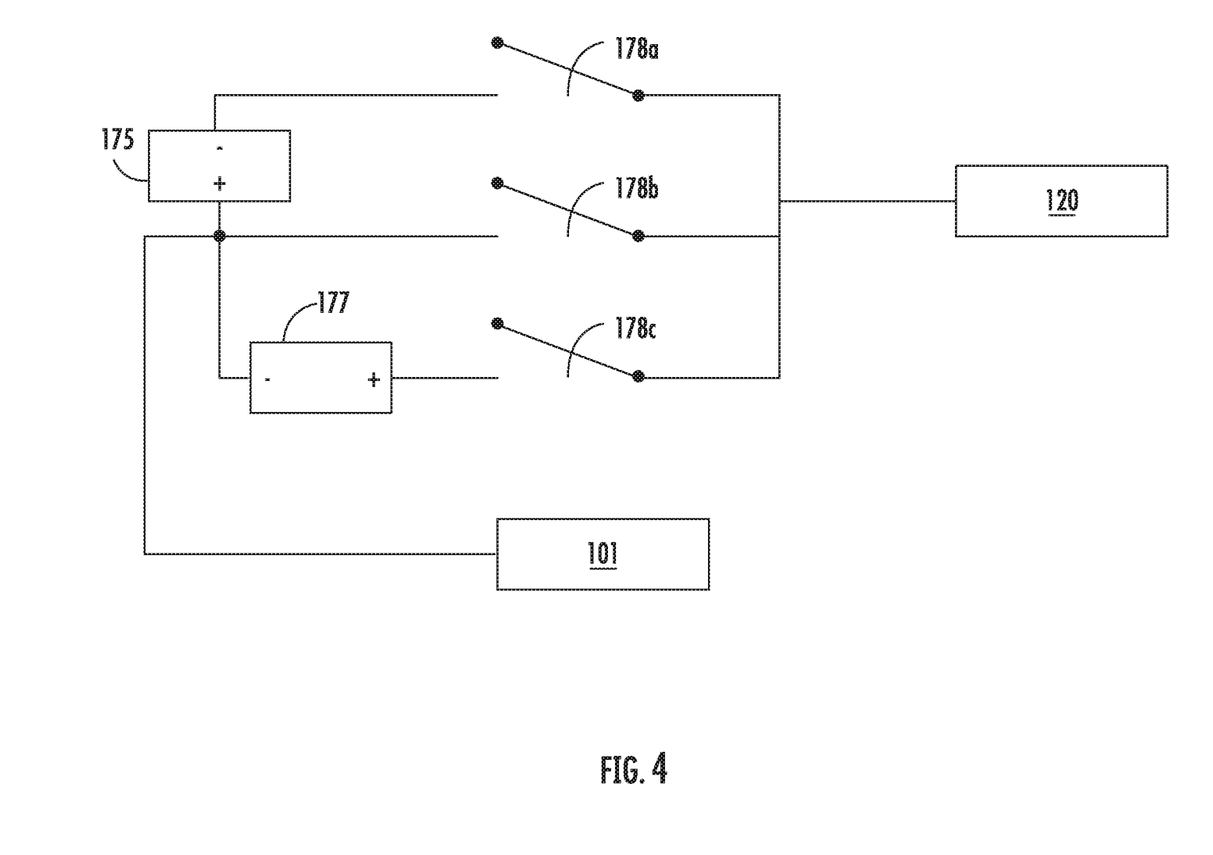
FIG. 4 is a diagram showing the creation of the repeller voltage according to one embodiment.

While FIG. 3 shows single pole, double throw relays, other embodiments are also possible. For example, single pole, single throw switches may be used. In this embodiment, a plurality of switches is used to generate each output, where only one of the switches is closed. For example, if the voltage to be applied to one of the components can be one of three different voltages, three single pole, single throw switches may be used to achieve this function. For example, the voltage applied to the repeller may be the same as the voltage of the chamber walls 101, the voltage of the cathode bias power supply 175, the voltage of the electrode power supply 177, or left floating. In this case, three single pole, single throw switches may be arranged in parallel, as shown in FIG. 4. The following table shows the various voltages that may be applied to the repeller 120.

TABLE 2

| Repeller voltage | Switch 178a position | Switch 178b position | Switch 178c position |
|---|---|---|---|
| Cathode power supply | Closed | Open | Open |
| Electrode Power Supply | Open | Open | Closed |
| Ground | Open | Closed | Open |
| Floating | Open | Open | Open |

An arrangement of single pole, single throw switches may also be used for any of the other components as well, if desired. For example, the circuit shown in FIG. 4 may be used to supply a voltage to any of the electrodes or to the cathode, if desired. If the output is to be one of three possible voltages, a single pole, triple throw switch may be used. Further, two stacked single pole, double throw switches may also be used to select one or three possible voltages.

Thus, the configuration circuit 170 may comprise a plurality of switches, where the switches may be single throw, double throw, triple throw, multi-throw or any combination thereof. Additionally, the switches may be relays or any other suitable switching mechanism.

Figure 5:
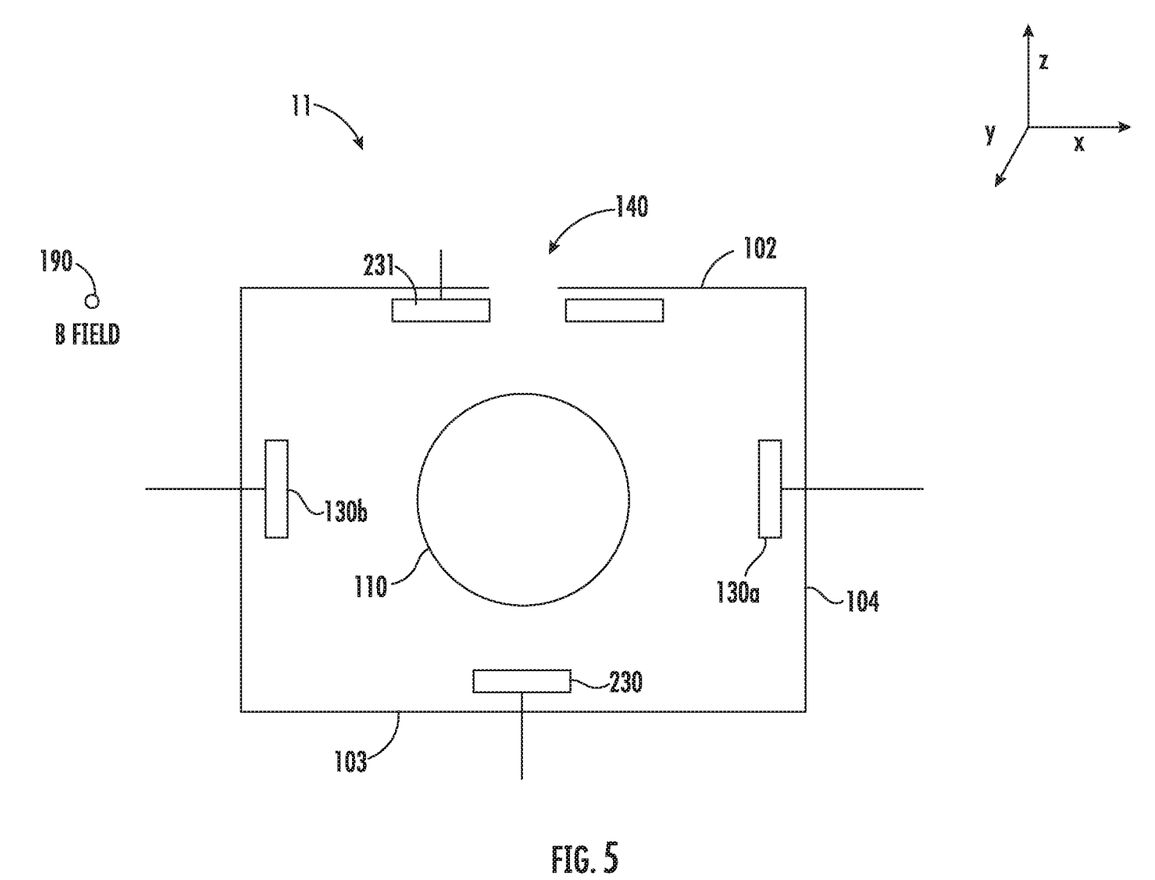
FIG. 5 is a cross-sectional view of an ion source according to another embodiment.

While FIGS. 1-3 show an ion source 10 having a cathode 110, a repeller 120, and two electrodes, the disclosure is not limited to this embodiment. FIG. 5 shows a cross-section of another embodiment of an ion source 11, that includes additional electrodes on the extraction plate 102 and the bottom wall 103. All other aspects of this ion source 11 are the same as described with respect to FIGS. 1-2. Thus, like the ion source 10 of FIGS. 1-2, this ion source 11 has a cathode 110, a repeller 120, a filament power supply 165, a filament bias power supply 115, cathode bias power supply 175, an electrode power supply 177 and a configuration circuit.

In this embodiment, a bottom electrode 230 is disposed proximate the bottom wall 103 and a top electrode 231 is disposed proximate the extraction plate 102, such that the top and bottom electrodes are within the chamber 100. One or more additional power supplies may be employed in this configuration. Thus, in this embodiment, the configuration circuit may have up to six outputs.

Figure 6:
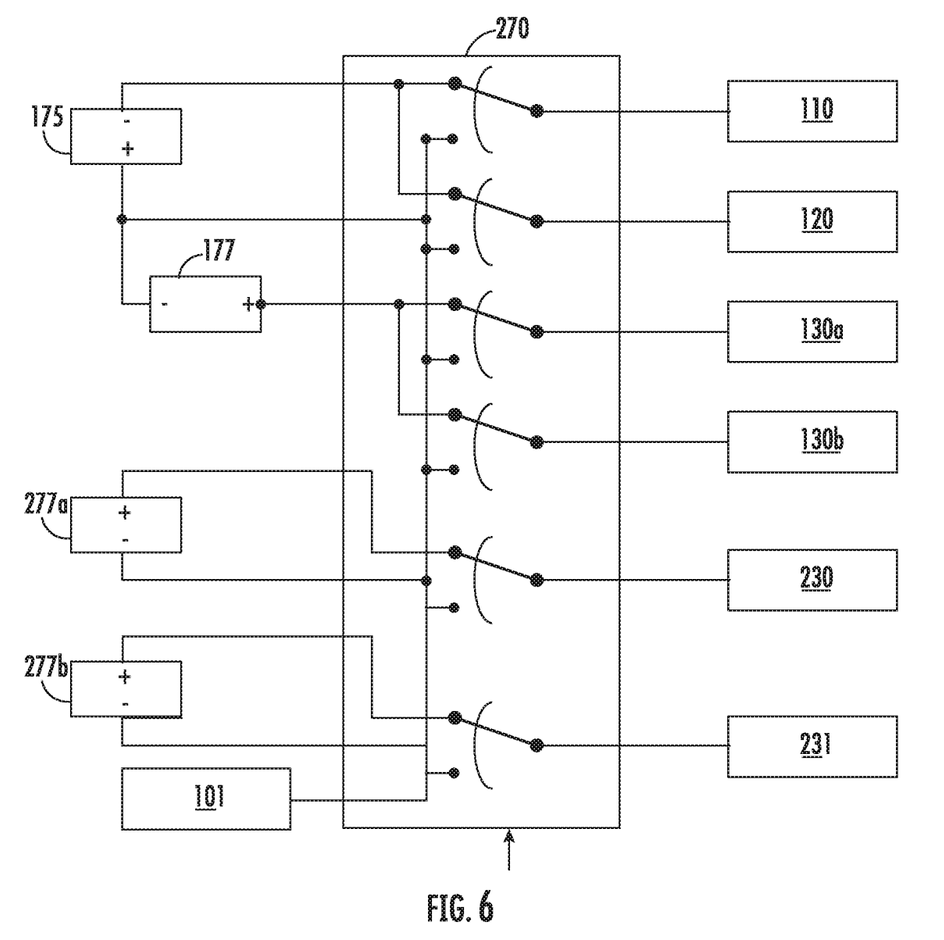
FIG. 6 is a diagram showing the inputs and outputs to the configuration circuit in accordance with an embodiment.

A representative drawing of the representative configuration circuit 270 for ion source 11 is shown in FIG. 6. In this figure, the cathode bias power supply 175 and the electrode power supply 177 remain input voltages to the configuration circuit 270. Additionally, one or more auxiliary power supplies 277*a*, 277*b* may also be employed. The configuration circuit 270 may also be in communication with the electrically conductive chamber walls, which may serve as the reference for the other voltages. These auxiliary power supplies 277*a*, 277*b* may supply a voltage that is positive or negative relative to the chamber walls 101.

In this particular embodiment, either the output voltage from the cathode bias power supply 175 or ground is supplied to the cathode 110. Either the output voltage from the cathode bias power supply 175 or ground is supplied to the repeller 120. Either the output voltage from the electrode power supply 177 or ground is supplied to the first electrode 130*a*. Either the output voltage from the electrode power supply 177 or ground is supplied to the second electrode 130*b*. Either the output voltage from the auxiliary power supply 277*a* or ground is supplied to the bottom electrode 230. Either the output voltage from the auxiliary power supply 277*b* or ground is supplied to the top electrode 231. Of course, other arrangements can also be created, and the disclosure is not limited to this representation. For example, different power supplies may be used to supply different voltages to the first electrode 130*a* and the second electrode 130*b*. As stated above, more or fewer power supplies may be used as inputs to the configuration circuit 270. Further, while this figure shows six different biased components, the number of biased components is not limited by this disclosure.

The configuration circuit 270 shown in FIG. 6 may have up to six outputs: the voltage for the cathode 110; the voltage for the repeller 120; the voltage for the first electrode 130*a*; the voltage for the second electrode 130*b*; the voltage for the bottom electrode 230; and the voltage for the top electrode 231. In certain embodiments, the repeller 120 is at the same voltage as the cathode 110, so one switch may be eliminated.

In certain embodiments, one or more of the other electrodes may be at a fixed voltage or may be tied to another component. In these cases, additional switches may be eliminated.

Thus, the configuration circuit 270 has a plurality of input voltages, where these input voltages include the output voltages from a plurality of power supplies. Another input voltage may include the voltage of the electrically conductive chamber walls, which provided the ground reference for the ion source 10. From this set of input voltages, the configuration circuit 270 selects an output for each of the cathode 110, the repeller 120, the first electrode 130a, the second electrode 130b, and optionally the top electrode 231 and the bottom electrode 230. As described above, the configuration circuit 270 may make these selections based on an input or inputs from the controller 180.

Figure 7:
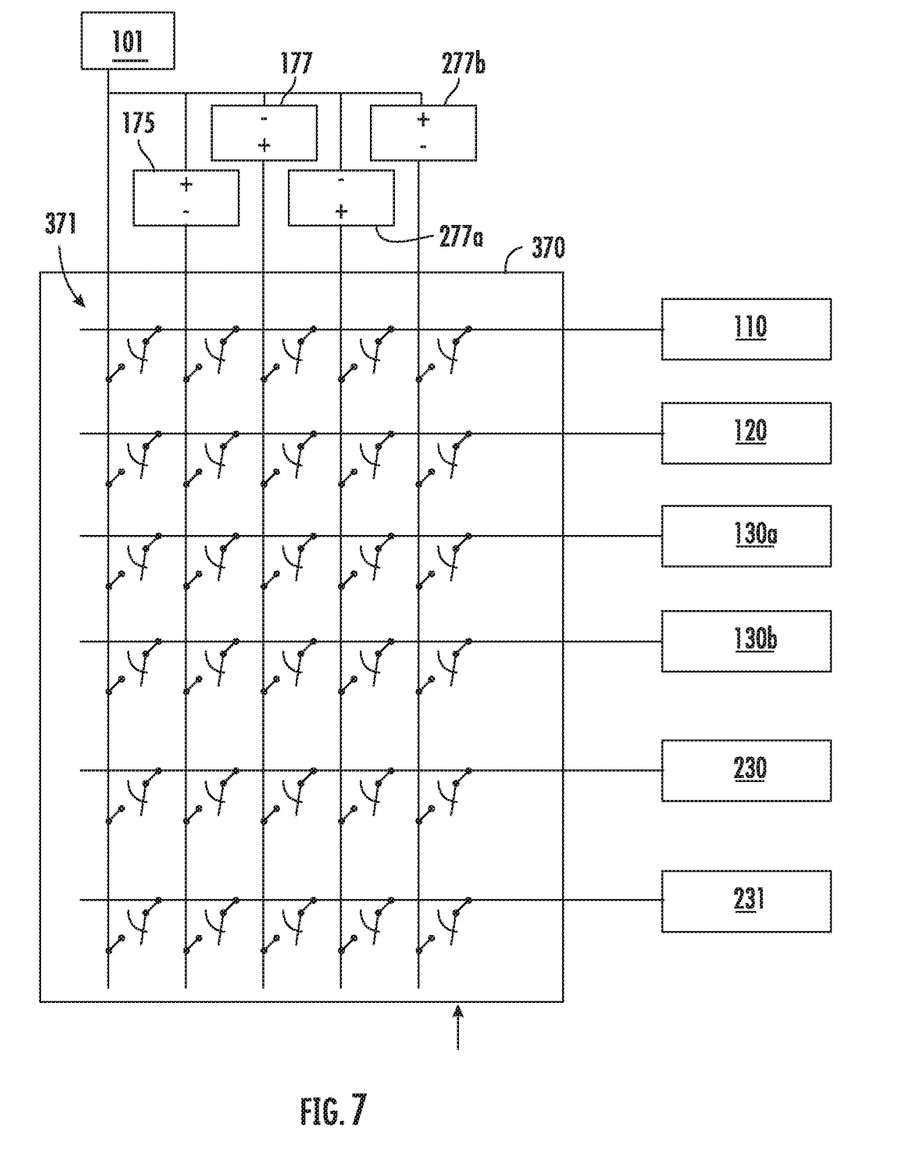
FIG. 7 is a diagram showing the configuration circuit in accordance with another embodiment.

FIG. 7 shows another embodiment of a configuration circuit 370. In this figure, the cathode bias power supply 175 and the electrode power supply 177 remain input voltages to the configuration circuit 370. Additionally, one or more auxiliary power supplies 277a, 277b may also be employed. The configuration circuit 370 may also be in communication with the electrically conductive chamber walls, which may serve as the reference for the other voltages.

In this embodiment, a cross point matrix 371 is used to allow the connection of any power supply to any electrode, cathode or repeller. A cross point matrix includes a switch between every input and every output. For each component, only one switch in the respective row is closed. Further, it is not necessary that each input be connected to any output. In other words, any number of switches in a given column may be closed. As with all of the other embodiments, the input to the configuration circuit 370 may be from the controller 180 or may be manually actuated.

Further, in certain embodiments, the ion source may not include all four electrodes (i.e. the first electrode 130a, the second electrode 130b, the top electrode 231 and the bottom electrode 230) shown in FIG. 5. Rather, the ion source may have fewer than four electrodes. For example, the ion source may have a top electrode 231 and only a first electrode 130a. In other embodiments, the ion source may have a first electrode 130a, a second electrode 130b and a bottom electrode 230. In other words, the ion source may comprise one or more electrodes disposed on the walls of the ion source. The configuration circuit may be used to supply an output voltage to one or more of the components in the ion source.

While the above disclosure is described with respect to an IHC ion source, the disclosure is not limited to this embodiment. For example, the ion source may be a Bernas ion source. A Bernas ions source is similar to an IHC ion source, but lacks a cathode. In other words, thermionic electrons are emitted directly from the filament into the chamber and these electrons are used to energize the plasma. Alternatively, the configuration circuit may be used with a Calutron ion source, which is similar to a Bernas ion source, but lacks a repeller. Similarly, the present disclosure is also applicable to a Freeman ion source, where the filament extends from one end of the ion source to the opposite end. In these embodiments, the configuration circuit 170 may be used to control the voltage applied to one or more of the following: the repeller 120, the first electrode 130a, the second electrode 130b, the bottom electrode 230 and the top electrode 231.

The embodiments described above in the present application may have many advantages. As described above, while indirectly heated cathode ion sources are well known, it has been found that different modes of operation may optimize the creation of particular species or ions. However, the cathode, repeller and electrodes are typically hardwired to a particular power supply. Consequently, it is common to simply use the IHC ion source in one mode, regardless of the species that are desired. The use of a configuration circuit allows the changing of the mode to be done quickly and without risk of error. Further, by utilizing a controller, it may be beneficial to have the controller determine the appropriate mode based on the selected recipe. This further optimizes and simplifies the operation of the IHC ion source.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:
   a chamber, comprising at least one electrically conductive wall;
   a cathode disposed on one end of the chamber;
   a repeller disposed on an opposite end of the chamber;
   a first electrode disposed on one side wall;
   a second electrode disposed on a second sidewall;
   a configuration circuit comprising a plurality of switches, wherein at least one of the plurality of switches is in electrical communication with the electrically conductive wall;
   at least one power supply having an output in communication with at least one of the plurality of switches in the configuration circuit;
   wherein the plurality of switches in the configuration circuit selects an output voltage to be supplied to at least one of the cathode, the repeller, the first electrode and the second electrode based on an input.

2. The ion source of claim 1, wherein the output voltage is supplied to the cathode, the at least one power supply comprises a cathode bias power supply and the output voltage is an output voltage from the cathode bias power supply or a voltage of the electrically conductive wall.

3. The ion source of claim 1, wherein the output voltage is supplied to the repeller, the at least one power supply comprises a cathode bias power supply and the output voltage is an output voltage from the cathode bias power supply or a voltage of the electrically conductive wall.

4. The ion source of claim 1, wherein the output voltage is supplied to the first electrode, the at least one power supply comprises an electrode power supply and the output voltage is an output voltage from the electrode power supply or a voltage of the electrically conductive wall.

5. The ion source of claim 1, wherein the output voltage is supplied to the second electrode, the at least one power supply comprises an electrode power supply and the output voltage is an output voltage from the electrode power supply or a voltage of the electrically conductive wall.

6. The ion source of claim 1, wherein the plurality of switches in the configuration circuit comprises a plurality of relays.

7. The ion source of claim 6, wherein the relays comprise single pole, double throw relays using magnetic coils.

8. The ion source of claim 1, wherein the plurality of switches in the configuration circuit comprises a cross point matrix.

9. The ion source of claim 1, wherein the output voltage is supplied to the cathode and is also supplied to the repeller.

10. The ion source of claim 1, wherein the at least one power supply comprises an electrode power supply and a cathode bias power supply and the configuration circuit is adapted to select the output voltage for each of the cathode, the repeller, the first electrode and the second electrode so as to support at least four different configurations.

11. The ion source of claim 10, wherein one of the four different configurations comprises a first configuration, where the cathode and repeller are electrically connected to the output voltage of the cathode bias power supply, and the first electrode and the second electrode are electrically connected to the electrically conductive wall.

12. The ion source of claim 10, wherein one of the four different configurations comprises a second configuration, where the cathode and repeller are electrically connected to the output voltage of the cathode bias power supply, and the second electrode is electrically connected to the electrically conductive wall and the first electrode is electrically connected to the output voltage of the electrode power supply.

13. The ion source of claim 10, wherein one of the four different configurations comprises a third configuration, where the cathode, the repeller and the second electrode are electrically connected to the electrically conductive wall, and the first electrode is electrically connected to the output voltage of the electrode power supply.

14. The ion source of claim 10, wherein one of the four different configurations comprises a fourth configuration, where the cathode and the repeller are electrically connected to the electrically conductive wall, and the first electrode and the second electrode are electrically connected to the output voltage of the electrode power supply.

15. An ion source, comprising:
a chamber, comprising at least one electrically conductive wall;
a configuration circuit in electrical communication with the electrically conductive wall;
a plurality of power supplies, an output voltage of each of plurality of power supplies in communication with the configuration circuit; and
at least one component, wherein the components comprise:
a cathode disposed on one end of the chamber;
a repeller disposed on an opposite end of the chamber;
a first electrode disposed on one side wall; and
a second electrode disposed on a second sidewall;
wherein the configuration circuit selects an output voltage to be supplied to the at least one component, wherein each output voltage is selected from the output voltage of one of the plurality of power supplies or a voltage of the electrically conductive wall such that the configuration circuit allows the ion source to be operated in a plurality of modes.

16. The ion source of claim 15, wherein the ion source comprises at least two of the components.

17. The ion source of claim 16, wherein the configuration circuit supplies an output voltage to each of the components.

18. The ion source of claim 17, wherein the ion source further comprises at least one of a top electrode disposed on an extraction plate and a bottom electrode disposed on a wall opposite the extraction plate, wherein the configuration circuit selects an output voltage to be supplied to the top electrode or the bottom electrode.

19. An ion source, comprising:
a chamber, comprising at least one electrically conductive wall;
a cathode disposed on one end of the chamber;
a repeller disposed on an opposite end of the chamber;
one or more electrodes disposed on walls of the chamber;
a configuration circuit, comprising a plurality of switches, wherein at least one of the plurality of switches is in electrical communication with the electrically conductive wall;
a cathode bias power supply having an output in communication with at least one of the plurality of switches in the configuration circuit;
an electrode power supply having an output in communication with at least one of the plurality of switches in the configuration circuit; and
a controller;
wherein the controller provides an input to the configuration circuit, and the plurality of switches in the configuration circuit selects an output voltage to be supplied to the cathode, the repeller, and the electrodes based on the input.

20. The ion source of claim 19, wherein the controller comprises an input device, and an operator enters information via the input device, and the controller uses the information to provide the input to the configuration circuit.

* * * * *